(12) United States Patent
Trinkle et al.

(10) Patent No.: US 12,745,492 B2
(45) Date of Patent: Sep. 22, 2026

(54) LIGHT-EMITTING DIODE PACKAGES WITH SELECTIVELY PLACED LIGHT-ALTERING MATERIALS AND RELATED METHODS

(71) Applicant: CreeLED, Inc., Durham, NC (US)

(72) Inventors: Sarah Trinkle, Broadway, NC (US); Alexis Rile, Durham, NC (US); Robert Wilcox, Rolesville, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 443 days.

(21) Appl. No.: 17/674,430

(22) Filed: Feb. 17, 2022

(65) Prior Publication Data

US 2023/0261154 A1 Aug. 17, 2023

(51) Int. Cl.
*H10H 20/853* (2025.01)
*H10H 20/01* (2025.01)
(Continued)

(52) U.S. Cl.
CPC .......... *H10H 20/853* (2025.01); *H10W 90/00* (2026.01); *H10H 20/0362* (2025.01);
(Continued)

(58) Field of Classification Search
CPC ..... H01L 33/54; H01L 25/0753; H01L 33/32; H01L 33/505; H01L 33/60;
(Continued)

(56) References Cited

U.S. PATENT DOCUMENTS

D100,040 S 6/1936 Petersen
D103,671 S 3/1937 Connor
(Continued)

FOREIGN PATENT DOCUMENTS

CN 102280539 A 12/2011
CN 114256438 A 3/2022
(Continued)

OTHER PUBLICATIONS

M G Chemicals, 832HT—High Temperature Epoxy, Sep. 27, 2021, M G Chemicals, https://web.archive.org/web/20210927001739/https://mgchemicals.com/products/potting-compounds/epoxy-potting/high-temperature-epoxy/ (Year: 2021).*
(Continued)

*Primary Examiner* — Shaun M Campbell
(74) *Attorney, Agent, or Firm* — Withrow & Terranova, P.L.L.C.

(57) ABSTRACT

Light-emitting diode (LED) packages and more particularly LED packages with selectively placed light-altering materials and related methods are disclosed. Selectively placed light-altering materials are provided that are arranged along peripheral edges of LED chips and along portions of underlying submounts. By covering peripheral edges of LED chips without covering entire submount surfaces, light-altering materials may be provided in reduced amounts while still redirecting laterally propagating light from the LED chips. Methods of selectively placing light-altering materials include selectively dispensing one or more droplets on submount portions that are proximate LED chip edges and allowing the one or more droplets to wick about the LED chip edges and portions of the submount before curing in place.

23 Claims, 10 Drawing Sheets

(51) Int. Cl.

| | |
|---|---|
| ***H10H 20/825*** | (2025.01) |
| ***H10H 20/851*** | (2025.01) |
| ***H10H 20/856*** | (2025.01) |
| ***H10W 90/00*** | (2026.01) |

(52) U.S. Cl.
CPC ....... *H10H 20/0363* (2025.01); *H10H 20/825* (2025.01); *H10H 20/8514* (2025.01); *H10H 20/856* (2025.01)

(58) Field of Classification Search
CPC ....... H01L 2933/005; H01L 2933/0058; H01L 25/167; H01L 2933/0091
See application file for complete search history.

(56) References Cited

U.S. PATENT DOCUMENTS

| | | | | |
|---|---|---|---|---|
| D521,948 | S | 5/2006 | Inoue | |
| D573,554 | S | 7/2008 | Kobayakawa | |
| D574,336 | S | 8/2008 | Okada et al. | |
| D575,244 | S | 8/2008 | Lee | |
| D576,574 | S | 9/2008 | Kobayakawa | |
| D596,592 | S | 7/2009 | Yong et al. | |
| D602,451 | S | 10/2009 | Gielen | |
| D615,504 | S | 5/2010 | Keller et al. | |
| D615,505 | S | 5/2010 | Butterworth et al. | |
| D623,151 | S | 9/2010 | Hwang et al. | |
| D623,152 | S | 9/2010 | Hwang et al. | |
| D642,142 | S | 7/2011 | Kuwaharada et al. | |
| D649,943 | S | 12/2011 | Kuwaharada et al. | |
| D650,342 | S | 12/2011 | Kuwaharada et al. | |
| D650,343 | S | 12/2011 | Andrews et al. | |
| D660,257 | S | 5/2012 | Andrews et al. | |
| D667,802 | S | 9/2012 | Otaki et al. | |
| D672,731 | S | 12/2012 | Bergmann et al. | |
| D673,126 | S | 12/2012 | Donofrio et al. | |
| D673,127 | S | 12/2012 | Cho et al. | |
| D674,758 | S | 1/2013 | Wu et al. | |
| D675,169 | S | 1/2013 | Chou | |
| D691,973 | S | 10/2013 | Donofrio et al. | |
| D697,642 | S | 1/2014 | Amari et al. | |
| D704,154 | S | 5/2014 | Andrews et al. | |
| D705,957 | S | 5/2014 | Lin | |
| D711,841 | S | 8/2014 | Britt et al. | |
| D712,849 | S | 9/2014 | Britt et al. | |
| D713,804 | S | 9/2014 | Britt et al. | |
| D718,258 | S | 11/2014 | Lowes et al. | |
| 9,006,763 | B2 | 4/2015 | Ueno et al. | |
| 9,070,850 | B2 | 6/2015 | Keller et al. | |
| D738,832 | S | 9/2015 | Hussell et al. | |
| D741,821 | S | 10/2015 | Song | |
| D749,051 | S | 2/2016 | Clark et al. | |
| 9,349,929 | B2 | 5/2016 | Clark et al. | |
| D762,183 | S | 7/2016 | Kim et al. | |
| D762,184 | S | 7/2016 | Kiridoshi et al. | |
| D763,472 | S | 8/2016 | Watson-Levack | |
| D763,473 | S | 8/2016 | Watson-Levack | |
| 9,461,024 | B2 | 10/2016 | Hussell et al. | |
| 9,515,055 | B2 | 12/2016 | Britt et al. | |
| D777,122 | S | 1/2017 | Bergmann et al. | |
| 9,627,361 | B2 | 4/2017 | Andrews et al. | |
| D790,486 | S | 6/2017 | Reiherzer et al. | |
| D800,679 | S | 10/2017 | Omori | |
| 9,887,327 | B2 | 2/2018 | Reiherzer et al. | |
| D833,989 | S | 11/2018 | Tamura | |
| D844,576 | S | 4/2019 | Miura | |
| 10,388,838 | B2 | 8/2019 | Hung et al. | |
| 10,439,112 | B2 | 10/2019 | Clark et al. | |
| 10,516,081 | B1 | 12/2019 | Xin et al. | |
| 10,522,722 | B2 | 12/2019 | Damborsky et al. | |
| 10,854,780 | B2 | 12/2020 | Hung et al. | |
| D915,308 | S | 4/2021 | Maruyama | |
| D915,309 | S | 4/2021 | Maruyama | |
| D926,714 | S | 8/2021 | Wilcox et al. | |
| 11,456,443 | B2 | 9/2022 | Montgomery | |
| 11,552,229 | B2 | 1/2023 | Damborsky et al. | |
| D996,377 | S | 8/2023 | Celano et al. | |
| D996,378 | S | 8/2023 | Trinkle et al. | |
| 2005/0173721 | A1 | 8/2005 | Isoda | |
| 2006/0138945 | A1 | 6/2006 | Wolk et al. | |
| 2007/0253209 | A1 | 11/2007 | Loh et al. | |
| 2008/0054280 | A1 | 3/2008 | Reginelli et al. | |
| 2009/0017566 | A1* | 1/2009 | Basin | H01L 24/97 257/E33.059 |
| 2009/0101929 | A1* | 4/2009 | Mo | H10H 20/018 257/E33.068 |
| 2010/0117099 | A1 | 5/2010 | Leung | |
| 2010/0140633 | A1 | 6/2010 | Emerson | |
| 2010/0140634 | A1 | 6/2010 | van de Ven et al. | |
| 2010/0252851 | A1 | 10/2010 | Emerson et al. | |
| 2010/0258827 | A1 | 10/2010 | Lee et al. | |
| 2011/0062482 | A1 | 3/2011 | Solomensky et al. | |
| 2011/0175117 | A1* | 7/2011 | Jagt | H10H 20/841 257/E33.061 |
| 2011/0210358 | A1* | 9/2011 | Kim | H01L 33/502 |
| 2011/0220920 | A1 | 9/2011 | Collins et al. | |
| 2012/0086024 | A1 | 4/2012 | Andrews et al. | |
| 2012/0087108 | A1 | 4/2012 | Ke et al. | |
| 2012/0112661 | A1* | 5/2012 | van de Ven | H05B 45/30 |
| 2013/0092960 | A1 | 4/2013 | Wilcox et al. | |
| 2013/0105835 | A1 | 5/2013 | Wu et al. | |
| 2013/0141920 | A1 | 6/2013 | Emerson et al. | |
| 2013/0322068 | A1 | 12/2013 | Clark et al. | |
| 2013/0322070 | A1 | 12/2013 | Clark et al. | |
| 2013/0322088 | A1 | 12/2013 | Huang et al. | |
| 2014/0131748 | A1 | 5/2014 | Song | |
| 2014/0291715 | A1 | 10/2014 | Reiherzer et al. | |
| 2014/0306246 | A1 | 10/2014 | Chen et al. | |
| 2015/0179903 | A1 | 6/2015 | Pun et al. | |
| 2015/0221839 | A1 | 8/2015 | Park et al. | |
| 2016/0079478 | A1 | 3/2016 | Kong et al. | |
| 2017/0069606 | A1* | 3/2017 | Gould | H10H 20/8514 |
| 2017/0069806 | A1 | 3/2017 | Kim et al. | |
| 2017/0084587 | A1 | 3/2017 | Hung et al. | |
| 2017/0098746 | A1* | 4/2017 | Bergmann | H10H 20/857 |
| 2017/0179352 | A1 | 6/2017 | Song | |
| 2017/0345801 | A1 | 11/2017 | Lin et al. | |
| 2018/0151790 | A1* | 5/2018 | Kim | H10H 20/855 |
| 2018/0357948 | A1 | 12/2018 | Chen et al. | |
| 2019/0198709 | A1 | 6/2019 | Wildeson et al. | |
| 2019/0326485 | A1* | 10/2019 | Damborsky | H10H 20/84 |
| 2019/0355886 | A9 | 11/2019 | Hussell | |
| 2019/0371974 | A1 | 12/2019 | Hussell | |
| 2020/0075822 | A1 | 3/2020 | Suich et al. | |
| 2020/0105974 | A1* | 4/2020 | Ozeki | H01L 33/44 |
| 2020/0212277 | A1* | 7/2020 | Ozeki | H01L 33/502 |
| 2020/0313058 | A1* | 10/2020 | Ukawa | H01L 33/46 |
| 2020/0335673 | A1* | 10/2020 | Kim | H10H 20/856 |
| 2020/0411730 | A1 | 12/2020 | Andrews et al. | |
| 2021/0028401 | A1 | 1/2021 | Montgomery et al. | |
| 2021/0083153 | A1* | 3/2021 | Kayama | H01L 33/56 |
| 2022/0005987 | A1 | 1/2022 | Wilcox et al. | |
| 2022/0139890 | A1 | 5/2022 | Lin et al. | |
| 2022/0165923 | A1 | 5/2022 | Kamp et al. | |
| 2022/0415977 | A1 | 12/2022 | Lee | |
| 2023/0140302 | A1 | 5/2023 | Miller et al. | |
| 2023/0163261 | A1 | 5/2023 | Lu et al. | |
| 2023/0260972 | A1 | 8/2023 | Celano et al. | |

FOREIGN PATENT DOCUMENTS

| | | | |
|---|---|---|---|
| JP | D1353072 | A | 3/2009 |
| JP | 2018018994 | A | 2/2018 |
| JP | D1655194 | A | 3/2020 |
| TW | D140189 | S | 4/2011 |
| TW | D141208 | S | 6/2011 |
| TW | D149503 | S | 10/2012 |
| TW | D157837 | S | 12/2013 |
| TW | D170851 | S | 10/2015 |
| TW | D188043 | S | 1/2018 |
| WO | 2010035206 | A1 | 4/2010 |
| WO | 2018088671 | A1 | 5/2018 |
| WO | 2021023532 | A1 | 2/2021 |
| WO | 2021100454 | A1 | 5/2021 |

(56) References Cited

FOREIGN PATENT DOCUMENTS

OTHER PUBLICATIONS

M G Chemicals, 832HT Technical Data Sheet, Nov. 21, 2019, M G Chemicals, https://web.archive.org/web/20201028085732/https://www.mgchemicals.com/downloads/tds/tds-832ht-2parts.pdf (Year: 2019).*

Preliminary Examination Report for Taiwanese Patent Application No. 112103007, mailed Sep. 20, 2023, 17 pages.

International Search Report and Written Opinion for International Patent Application No. PCT/US2023/018595, mailed Jul. 31, 2023, 13 pages.

Examination Report for Taiwanese Patent Application No. 112303066, mailed Oct. 19, 2023, 9 pages.

Notice of Allowance for U.S. Appl. No. 29/877,879, mailed Aug. 26, 2024, 9 pages.

Examination Report for Taiwanese Patent Application No. 111303915, mailed Mar. 24, 2023, 4 pages.

Notice of Allowance for U.S. Appl. No. 29/829,994, mailed Mar. 15, 2023, 8 pages.

Notice of Allowance for U.S. Appl. No. 29/827,155, mailed Mar. 15, 2023, 9 pages.

Office Action for Chinese Patent Application No. 202230530277.0, mailed Jul. 21, 2023, 8 pages.

Notice of Allowance for Taiwanese Patent Application No. 112303066, mailed Feb. 19, 2024, 3 pages.

Notice of Allowance for U.S. Appl. No. 29/877,887, mailed Mar. 6, 2024, 8 pages.

Notification to Grant for Chinese Patent Application No. 202230530277.0, mailed Feb. 22, 2024, 4 pages.

Office Action for Taiwanese Patent Application No. 112112910, mailed Feb. 22, 2024, 17 pages.

Non-Final Office Action for U.S. Appl. No. 17/726,072, mailed Oct. 10, 2024, 7 pages.

International Search Report and Written Opinion for International Patent Application No. PCT/US2023/062635, mailed May 22, 2023, 13 pages.

Notice of Allowance for Taiwanese Patent Application No. 111303915, mailed Sep. 1, 2023, 5 pages.

Notification to Grant for Chinese Patent Application No. 202430228569.8, mailed Nov. 27, 2024, 4 pages.

Reasons for Rejection for Taiwanese Patent Application No. 112112910, mailed Nov. 12, 2024, 8 pages.

Non-Final Office Action for U.S. Appl. No. 17/674,448, mailed Dec. 11, 2024, 20 pages.

* cited by examiner

LIGHT-EMITTING DIODE PACKAGES WITH SELECTIVELY PLACED LIGHT-ALTERING MATERIALS AND RELATED METHODS

FIELD OF THE DISCLOSURE

The present disclosure relates to light-emitting diode (LED) packages and more particularly to LED packages with selectively placed light-altering materials and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, indium phosphide, aluminum nitride, gallium arsenide-based materials, and/or from organic semiconductor materials. Photons generated by the active region are initiated in all directions.

Lumiphoric materials, such as phosphors, may be arranged in light emission paths of LED emitters to convert portions of light to different wavelengths. LED packages have been developed that can provide mechanical support, electrical connections, and encapsulation for LED emitters. Light emissions that exit surfaces of LED emitters typically interact with various elements or surfaces of the LED package and lumiphoric materials before exiting, thereby increasing opportunities for light loss and potential non-uniformity of light emissions. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

Aspects disclose herein relate to light-emitting diode (LED) packages and more particularly to LED packages with selectively placed light-altering materials and related methods. Selectively placed light-altering materials are provided that are arranged along peripheral edges of LED chips and along portions of underlying submounts. By covering peripheral edges of LED chips without covering entire submount surfaces, light-altering materials may be provided in reduced amounts while still redirecting laterally propagating light from the LED chips. Methods of selectively placing light-altering materials include selectively dispensing one or more droplets on submount portions that are proximate LED chip edges and allowing the one or more droplets to wick about the LED chip edges and portions of the submount before curing in place.

In one aspect, an LED package comprises: a submount; at least one LED chip on the submount, the at least one LED chip including a first side, a second side that is mounted to the submount, and peripheral edges that bound the first side and the second side; and a light-altering material on the peripheral edges of the at least one LED chip and on portions of the submount that are proximate the at least one LED chip such that peripheral edges of the light-altering material are arranged on the submount in a position that is between peripheral edges of the submount and the at least one LED chip. In certain embodiments, a height of the light-altering material above the submount decreases across the submount with increasing distance from the peripheral edges of the at least one LED chip. In certain embodiments, the height of the light-altering material at the peripheral edges of the light-altering material is less than 10% of a height of the at least one LED chip. The LED package may further comprise an electrical overstress element on the submount, wherein the light-altering material is further arranged to surround edges of the electrical overstress element. The LED package may further comprise an encapsulant that is arranged on the submount, wherein the encapsulant includes a lens portion and a flash portion that forms a lateral extension of the encapsulant from the lens portion to the peripheral edges of the submount, wherein the peripheral edges of the light-altering material are registered within the lens portion of the encapsulant. In certain embodiments, the at least one LED chip comprises a plurality of LED chips on the submount and the light-altering material is arranged on peripheral edges of each LED chip of the plurality of LED chips. In certain embodiments, the light-altering material is further arranged in gaps formed between neighboring LED chips of the plurality of LED chips.

The LED package may further comprise a lumiphoric material that is arranged on the first side of the at least one LED chip and on the light-altering material. In certain embodiments, a height of the lumiphoric material above the submount decreases across the submount with increasing distance from the peripheral edges of the at least one LED chip. In certain embodiments, portions of the lumiphoric material are arranged on portions of the submount that are outside the peripheral edges of the light-altering material. The LED package may further comprise an encapsulant that is arranged on the submount, wherein the encapsulant includes a lens portion and a flash portion that forms a lateral extension of the encapsulant from the lens portion to the peripheral edges of the submount, wherein the peripheral edges of the light-altering material are registered within the lens portion of the encapsulant and the portions of the lumiphoric material are registered with the flash portion of the encapsulant. The LED package may further comprise a lumiphoric material that is arranged on the first side of the at least one LED chip, wherein portions of the lumiphoric material are arranged between the light-altering material and the submount.

In another aspect, a method comprises: providing at least one light-emitting diode (LED) chip on a submount; dispensing one or more droplets of light-altering material proximate the at least one LED chip on the submount; allowing the one or more droplets of light-altering material to wick along a surface of the submount and along peripheral edges of the at least one LED chip; and curing the light-altering material. In certain embodiments, dispensing the one or more droplets of light-altering material comprises dispensing a plurality of droplets of light-altering material proximate the peripheral edges of the at least one LED chip. The method may further comprise allowing the plurality of droplets of light-altering material to coalesce along the surface of the submount and along the peripheral edges of the at least one LED chip. In certain embodiments, the one or more droplets of light-altering material are allowed to wick along the surface of the submount at a temperature in a range from 20° C. to 100° C. The method may further comprise forming an encapsulant on the at least one LED chip and on the light-altering material. The method may further comprise forming a lumiphoric material on the at least one LED chip before dispensing the one or more droplets of light-altering material. The method may further comprise forming a lumiphoric material on the at least one LED chip after curing the light-altering material.

In another aspect, an LED package comprises: a submount; at least one LED chip on the submount, the at least one LED chip including a first side, a second side that is mounted to the submount, and peripheral edges that bound the first side and the second side; a lumiphoric material on the first side and on the peripheral edges of the at least one LED chip; and a light-altering material on the lumiphoric material and proximate the peripheral edges of the at least one LED chip such that peripheral edges of the light-altering material are arranged in positions that are between peripheral edges of the submount and the at least one LED chip. In certain embodiments, a height of the light-altering material above the submount decreases across the submount with increasing distance from the peripheral edges of the at least one LED chip. The LED package may further comprise an encapsulant that is arranged on the submount, wherein the encapsulant includes a lens portion and a flash portion that forms a lateral extension of the encapsulant from the lens portion to the peripheral edges of the submount, wherein the peripheral edges of the light-altering material are registered within the lens portion of the encapsulant. In certain embodiments, a height of the light-altering material above the submount is greater than a height of the at least one LED chip above the submount. The LED package may further comprise an electrical overstress element on the submount, wherein the light-altering material is further arranged to surround edges of the electrical overstress element.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
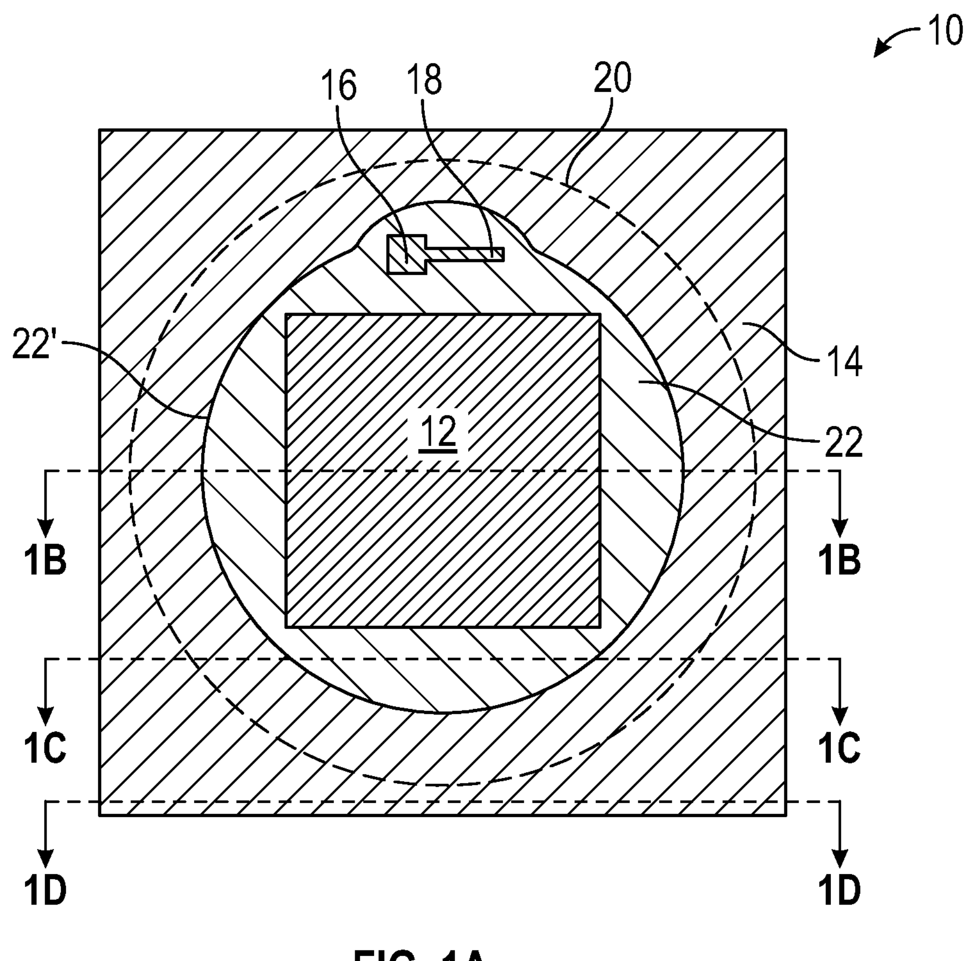
FIG. 1A is a top view of an exemplary light-emitting diode (LED) package according to principles of the present disclosure where a light-altering material is selectively placed within the LED package.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term “and/or” includes any and all combinations of one or more of the associated listed items.

It will be understood that when an element such as a layer, region, or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present. Likewise, it will be understood that when an element such as a layer, region, or substrate is referred to as being “over” or extending “over” another element, it can be directly over or extend directly over the other element or intervening elements may also be present. In contrast, when an element is referred to as being “directly over” or extending “directly over” another element, there are no intervening elements present. It will also be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

Relative terms such as “below” or “above” or “upper” or “lower” or “horizontal” or “vertical” may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms “a,” “an,” and “the” are intended to include the plural forms as well, unless the context clearly indicates otherwise. It will be further understood that the terms “comprises,” “comprising,” “includes,” and/or “including” when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclose herein relate to light-emitting diode (LED) packages and more particularly to LED packages with selectively placed light-altering materials and related methods. Selectively placed light-altering materials are provided that are arranged along peripheral edges of LED chips and along portions of underlying submounts. By covering peripheral edges of LED chips without covering entire submount surfaces, light-altering materials may be provided in reduced amounts while still redirecting laterally propagating light from the LED chips. Methods of selectively placing light-altering materials include selectively dispensing one or more droplets on submount portions that are proximate LED chip edges and allowing the one or more droplets to wick about the LED chip edges and portions of the submount before curing in place.

Before delving into specific details of various aspects of the present disclosure, an overview of various elements that may be included in exemplary LEDs of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or silicon. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In certain embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. In other embodiments, the LED chip and corresponding lumiphoric material may be configured to primarily emit converted light from the lumiphoric material so that aggregate emissions include little to no perceivable emissions that correspond to the LED chip itself.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or cover structure that is provided over an LED chip. Wavelength conversion elements or cover structures may include a support element and one or more lumiphoric materials that are provided by any suitable means, such as by coating a surface of the support element or by incorporating the lumiphoric materials within the support element. In some embodiments, the support element may be composed of a transparent material, a semi-transparent material, or a light-transmissive material, such as sapphire, SiC, silicone, and/or glass (e.g., borosilicate and/or fused quartz). Wavelength conversion elements and cover structures of the present disclosure may be formed from a bulk material which is optionally patterned and then singulated. In certain embodiments, the patterning may be performed by an etching process (e.g., wet or dry etching), or by another process that otherwise alters a surface, such as with a laser or saw. In certain embodiments, wavelength conversion elements and cover structures may be thinned before or after the patterning process is performed. In certain embodiments, wavelength conversion elements and cover structures may comprise a generally planar upper surface that corresponds to a light emission area of the LED package.

Wavelength conversion elements and cover structures may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In various embodiments, wavelength conversion elements may comprise configurations such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be “transparent” when at least 80% of emitted radiation that impinges on the layer or region emerges through the layer or region. Moreover, as used herein, a layer or region of an LED is considered to be “reflective” or embody a “mirror” or a “reflector” when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case UV LEDs, appropriate materials may be selected to provide a desired, and in some embodiments high, reflectivity and/or a desired, and in some embodiments low, absorption. In certain embodiments, a “light-transmissive” material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a leadframe. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term “light-reflective” refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects, light-reflective particles may also be referred to as light-scattering particles. A weight ratio of the light-reflective particles or scattering particles to a binder may comprise a range of about 0.15:1 to about 0.5:1, or in a range of about 0.5:1 to about 1:1, or in a range of about 1:1 to about 2:1, depending on a desired viscosity before curing. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray for absorbing light and increasing contrast. In certain embodiments, the light-altering material includes both light-reflective material and light-absorbing material suspended in a binder.

LED packages have been developed that include multiple LED chips that are clustered together to provide increased light output and/or the capability for a single LED package to emit multiple colors and/or peak wavelengths of light. Relative sizes or areas of individual LED chips within an LED package may be selected according to desired emission intensities and profiles. In certain embodiments, the LED chips within an LED package may have smaller sizes such as 0.5 millimeters (mm) by 0.5 mm and/or larger sizes such as 2 mm by 2 mm, or other ranges from 0.5 mm by 0.5 mm to 1 mm by 1 mm. In certain embodiments, a longest lateral dimension of each LED chip may be in a range from 0.5 mm to 2 mm, or in a range from 1 mm to 2 mm, or in a range from 0.5 mm to 1 mm. In such ranges where at least one dimension is 0.5 mm and greater, the LED chips may be well suited for providing high output powers in a compact footprint.

Despite advances in LED packaging technology, challenges remain in directing light emissions from LED chips and/or lumiphoric materials in desired directions with increased efficacy. Light emissions that are generated within active regions of LEDs and wavelength-converted light from lumiphoric materials may be omnidirectional in nature. In this regard, light may attempt to exit all sides of an LED chip within a package. According to aspects of the present disclosure, light-altering material arrangements are provided proximate to peripheral edges or sidewalls of LED chips that redirect laterally emitted light in desired light emitting directions, such as toward a top surface of the LED chip that is opposite a mounting surface for the LED chip. In this manner, such light-altering material arrangements may provide a two-dimensional light-emitting surface for LED chips, rather than three-dimensional light-emitting surfaces when light is allowed to exit LED chip sidewalls. Arrangements include selective placement of light-altering materials along LED package submounts such that the light-altering materials are proximate LED chip sidewalls without covering entire submount surfaces. By avoiding placement of light-altering materials in certain areas of the submount, other package elements, such as encapsulants and/or lens may be allowed to interact with and/or adhere to the submount without portions of the light-altering material therebetween. In certain aspects, such arrangements my allow the encapsulant to have reduced height above the submount. Selective placement of light-altering materials may involve dispensing one or more droplets of light-altering material proximate LED chip side walls, promoting wicking of the one or more droplets to spread around the LED chip, and curing the light-altering material in place.

Figure 1B:
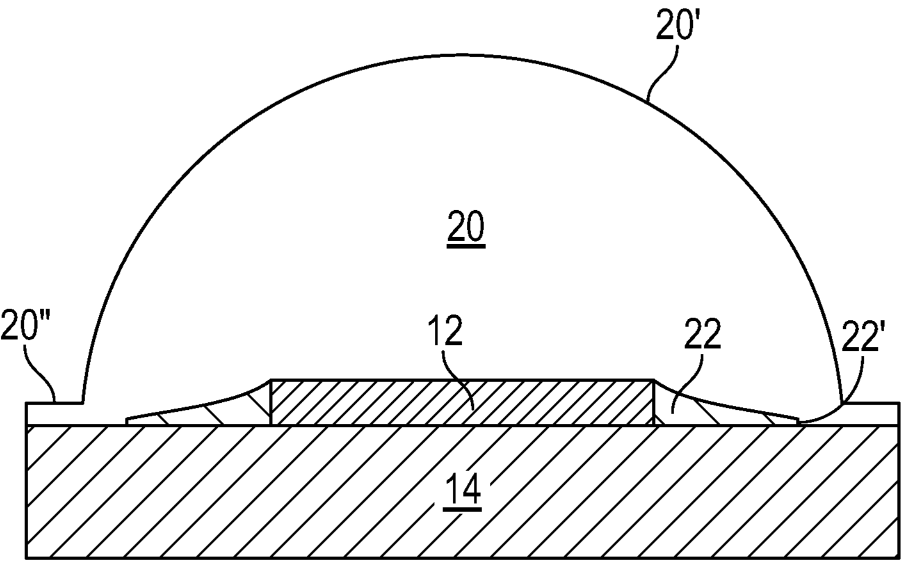
FIG. 1B is a cross-section of the LED package of FIG. 1A taken along the sectional line 1B-1B of FIG. 1A that includes the LED chip.
Figure 1C:
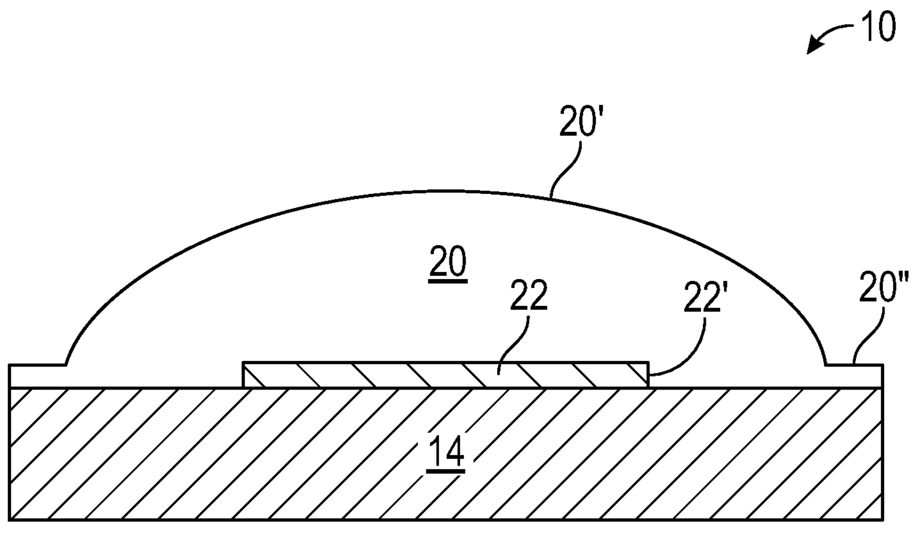
FIG. 1C is a cross-section of the LED package of FIG. 1A taken along the sectional line 1C-1C of FIG. 1A.
Figure 1D:
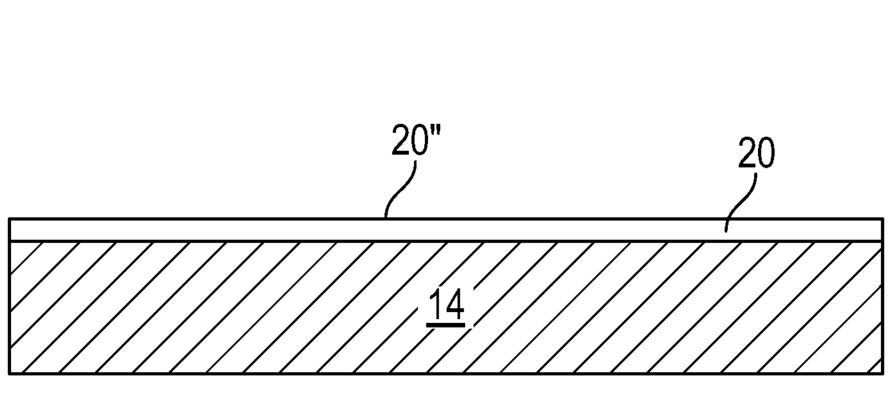
FIG. 1D is a cross-section of the LED package of FIG. 1A taken along the sectional line 1D-1D of FIG. 1A.

FIG. 1A is a top view of an exemplary LED package 10 according to principles of the present disclosure. FIG. 1B is a cross-section of the LED package 10 taken along the sectional line 1B-1B of FIG. 1A that includes an LED chip 12. FIG. 1C is a cross-section of the LED package 10 taken along the sectional line 1C-1C of FIG. 1A. FIG. 1D is a cross-section of the LED package taken along the sectional line 1D-1D of FIG. 1A. The LED package 10 includes the LED chip 12 that is provided on a submount 14. The LED chip 12 generally includes a first side, or top side, that is positioned opposite from the submount 14, a second side, or bottom side, that is mounted to the submount 14, and peripheral edges or sidewalls that bound the first side and the second side. In certain embodiments, an optional electrical overstress element 16, such as an electrostatic discharge element or Zener diode, may be provided on the submount 14 and electrically connected by way of a wire bond 18.

The LED package 10 may also include an encapsulant 20 that is provided on the submount 14. In certain embodiments, the encapsulant 20 may be molded into the shape of a lens having an outer surface 20' that is curved to shape a spectral output of the LED package 10. In this regard, the encapsulant may be configured to shape, collimate, and/or mix light generated within the LED package 10. Different molding techniques may provide the encapsulant 20 with many different shapes depending on desired light output, including hemispheric, ellipsoid bullet, flat, hex-shaped and square. In certain embodiments, a suitable shape for the encapsulant 20 includes both curved and planar surfaces, such as a hemispheric top portion with planar side surfaces. As illustrated in FIG. 1B, the outer surface 20' may be formed as a curved surface in the form of a hemispheric lens above the submount 14. Unless otherwise specified for any of the embodiments of the present disclosure, the principles of the present disclosure may be applicable to any shape of the encapsulant 20, including an arrangement where the outer surface 20' is a flat lens shape where the outer surface 20' is substantially parallel to the surface of the submount 14.

The LED package 10 includes a light-altering material 22 that is selectively formed on portions of the submount 14. The light-altering material 22 may be formed with a light-reflective and/or light-refractive material, and in certain embodiments the light-altering material 22 may be configured with a generally white color. As illustrated, the light-altering material 22 is arranged on peripheral edges of the LED chip 12 so that laterally propagating light from the LED chip 12 may be redirected toward a desired emission direction for the LED package 10 with reduced light loss. The light-altering material 22 may be arranged on or directly on the peripheral edges of the LED chip 12, and a peripheral edge 22' of the light-altering material 22 only partially covers the submount 14 outside of the LED chip 12. For example, the light-altering material 22 may be formed on all peripheral edges of the LED chip 12 and surround edges of the electrical overstress element 16 on the submount 14 without extending entirely to peripheral edges of the submount 14.

Since the peripheral edges 22' of the light-altering material 22 only partially cover the submount 14, other elements of the LED package 10 may contact the submount 14 outside the light-altering material 22. For example, the encapsulant 20 may be adhered to the light-altering material 22 and portions of the submount 14 outside the peripheral edges 22' of the light-altering material 22 as illustrated in the cross-sections of FIGS. 1B, 1C, and 1D. Such an arrangement may prevent or reduce an amount of the light-altering material 22 that may be present along a flash portion 20" of the encapsulant 20. The flash portion 20" may be defined as a lateral extension of the encapsulant 20 that is outside the curved outer surface 20' or lens portion of the encapsulant 20. The flash portion 20" is arranged to extend from the curved outer surface 20' or lens portion to the peripheral edges of the submount 14. The flash portion 20" is typically provided with a certain thickness to ensure suitable mechanical stability of the encapsulant 20. In this manner, if the light-altering material 22 is present underneath the flash portion 20", a same thickness of the flash portion 20" will position the encapsulant 20 higher above the submount 14. This may alter light emission from the LED package 10 by either raising the overall height of the encapsulant 20 or by providing a smaller size for the curved outer surface 20'. By reducing an amount of the light-altering material 22 that is present along the flash portion 20", such arrangements may be avoided.

As best illustrated in the cross-section of FIG. 1B, a height or thickness of the light-altering material 22 above the submount 14 may decrease with increasing distance from peripheral edges of the LED chip 12. In this regard, the height of the light-altering material 22 may be greatest at the peripheral edges of the LED chip 12. For example, the height of the light-altering material 22 at the peripheral edges 22' thereof may be less than 10%, or less than 5% of a corresponding height of the LED chip 12 while the height of the light-altering material 22 at the peripheral edges of the LED chip 12 may be in a range from 95% to 100% of the height of the LED chip 12. The height of the light-altering material 22 may be sloped, graded, and/or stepped with increasing distance from the LED chip 12 toward the peripheral edges 22' of the light-altering material 22. Notably, one or more peripheral edges 22' of the light-altering material 22 maybe positioned or registered on the submount 14 outside of the flash portion 20" and within the lens portion of the encapsulant 20.

Figure 2:
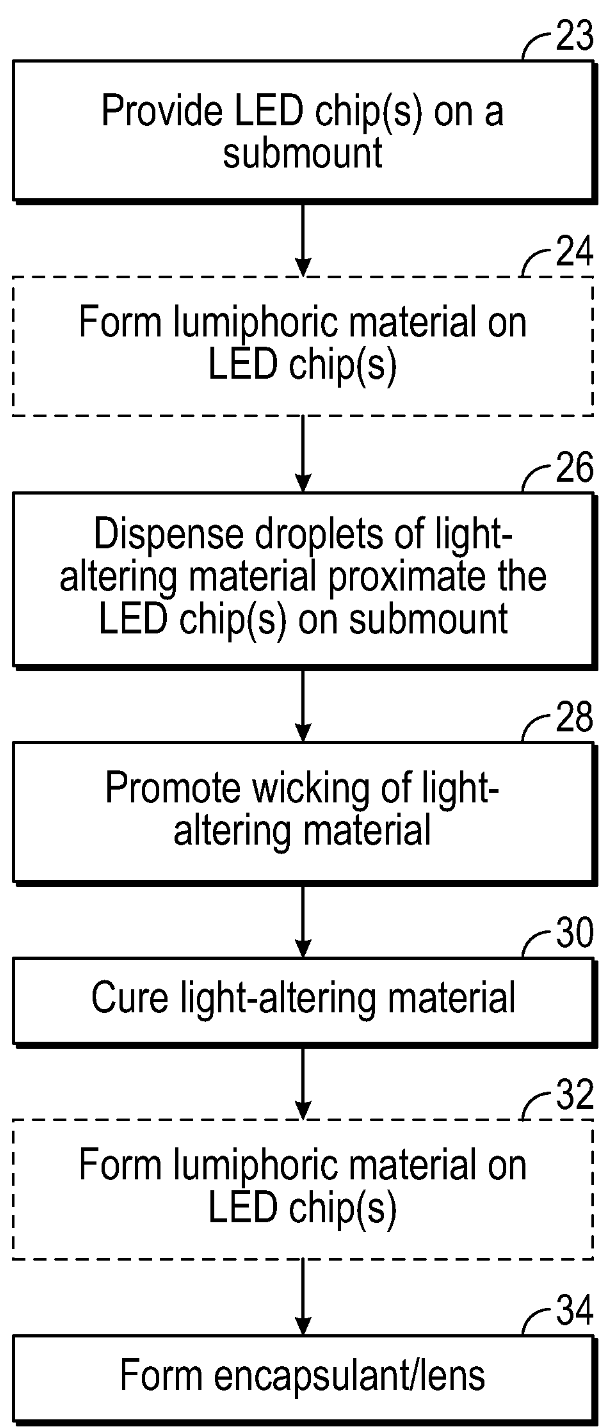
FIG. 2 illustrates an exemplary fabrication sequence for selective placement of light-altering material on a submount of an LED package, such as the LED package of FIGS. 1A to 1D.

FIG. 2 illustrates a fabrication sequence for selective placement of the light-altering material along the submount an LED package, such as the LED package 10 of FIGS. 1A to 1D. In a first step 23, one or more LED chips are provided or otherwise mounted on a submount. In an optional second step 24, depending on a desired emission color for the LED package, a lumiphoric material may be provided on at least one of the one or more of the LED chips.

In a third step 26, one or more droplets of the light-altering material may be selectively placed on the submount proximate the one or more LED chips. The droplets may be provided by a dispensing tool that is held in place for a time interval while a valve opens and then closes to selectively dispense the droplets only in one or more areas of the submount proximate the one or more LED chips. In a fourth step 28, capillary action or wicking of the light-altering material is promoted such that the droplets wet surfaces of the submount and peripheral edges of the LED chips. When multiple droplets are provided along different peripheral edges of an LED chip, the wicking may promote coalescing of the droplets to form a light-altering material that continuously surrounds peripheral edges of LED chips. Depending on the amount of wicking desired, the viscosity of the light-altering material may be varied in different embodiments. For example, applications with fewer droplets may be provided with lower viscosity since greater wicking distances may be needed for coalescing. Based on the particular viscosity of the droplets, the fourth step 28 may be performed for a time period at room temperature, particularly for applications with higher viscosity material. In other embodiments, the fourth step 28 may be performed for a time period at a temperature in a range from 20° C. to 100° C., or elevated temperatures in a range from 30° C. to 100° C. In such embodiments, the submount with dispensed droplets may be placed on a hot plate for a period of time until suitable coalescing is provided.

In a fifth step 30, the coalesced light-altering is cured in place. Specific curing temperatures may be dependent on the type of binder utilized for the light-altering material. For example, certain silicones that may be used may have curing temperatures in a range from 100° C. to 250° C., or in a range from 100° C. to 200° C. with care not to exceed silicone degradation temperatures. In an optional sixth step 32 and depending on a desired emission color for the LED package, a lumiphoric material may be provided on at least one of the one or more of the LED chips. In certain fabrication sequences, lumiphoric materials may only be provided by either the second step 24 or the sixth step 32. In still further embodiments, both the second step 24 and the sixth step 32 may be omitted, particularly for embodiments where LED chips are not subjected to wavelength conversion or for embodiments where lumiphoric materials are already incorporated or otherwise formed on the LED chips. In a seventh step 34, the encapsulant and/or lens may be formed over the one or more LED chips and the light-altering material. For shaped encapsulant embodiments, the encapsulant may be molded to the submount.

Light-altering materials are conventionally provided by continuously moving dispensing tools to cover submounts with the light-altering materials. In other conventional techniques, light-altering materials are continuously dispensed in ring shapes that are spaced from peripheral edges of LED chips. By selectively placing individual droplets of the light-altering material proximate peripheral edges of LED chips and allowing the droplets to coalesce by wicking action according to the fabrication sequence described above for FIG. 2, less overall amounts of light-altering material are needed to achieve suitable light emission patterns. Additionally, selectively placed light-altering materials according to the present disclosure may provide improved coverage of peripheral edges of LED chips and with reduced wicking along top sides of the LED chips. In this manner, the top side of an LED chip according to the present disclosure may form a primary light-emitting surface within a corresponding LED package. Advantageously, the above-described benefits of the present disclosure may also be obtained with reduced processing time compared with conventional dispensing techniques.

Figures 3A, 3B, 3C, 4A, 4B, 4C:
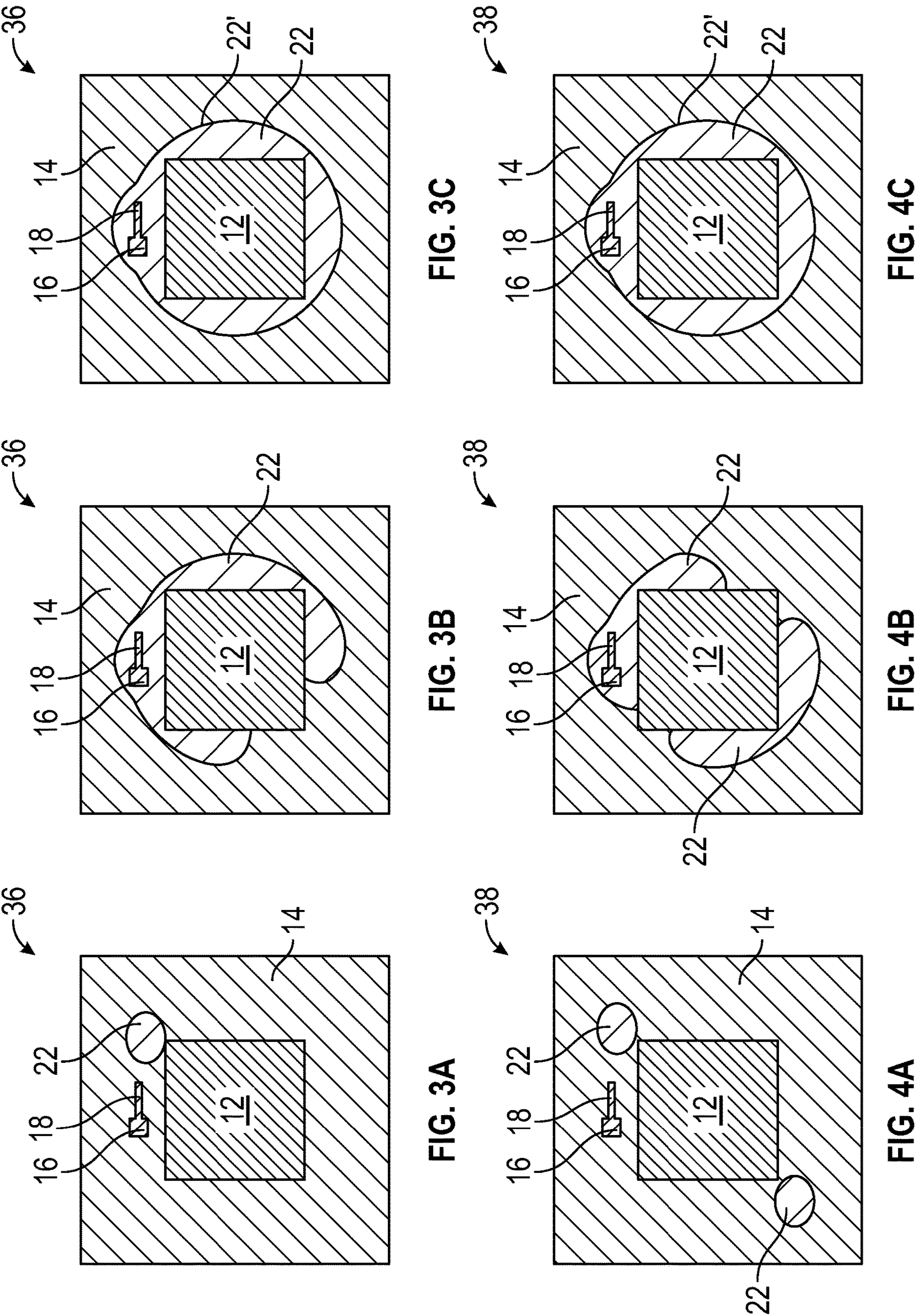
FIG. 3A is a top view of an LED package after selective dispensing of a droplet of light-altering material according to the fabrication sequence of FIG. 2.
FIG. 3B is a top view of the LED package of FIG. 3A during wicking of the light-altering material according to the fabrication sequence of FIG. 2.
FIG. 3C is a top view of the LED package of FIG. 3B after curing of the light-altering material according to the fabrication sequence of FIG. 2.
FIG. 4A is a top view of another LED package after selective dispensing of two droplets of light-altering material according to the fabrication sequence of FIG. 2.
FIG. 4B is a top view of the LED package of FIG. 4A during wicking of the light-altering material according to the fabrication sequence of FIG. 2.
FIG. 4C is a top view of the LED package of FIG. 4B after curing of the light-altering material according to the fabrication sequence of FIG. 2.

FIGS. 3A to 3C illustrate a top view of an LED package 36 at various fabrication steps of FIG. 2. In particular, FIG. 3A is a top view of the LED package 36 after the third step 26 of FIG. 2, FIG. 3B is a top view of the LED package 36 during the fourth step 28 of FIG. 2, and FIG. 3C is a top view of the LED package 36 after the fifth step 30 of FIG. 2. In FIG. 3A, a single droplet of the light-altering material 22 is dispensed proximate peripheral edges, or a corner, of the LED chip 12. As illustrated in FIG. 3B, the droplet of the light-altering material 22 is allowed to wet the surface of the submount 14, the peripheral edges of the LED chip 12, and edges of the optional electrical overstress element 16. As further illustrated in FIG. 3C, the droplet of the light-altering material 22 is allowed to completely surround peripheral edges of the LED chip 12 before being cured in place. Since the light-altering material 22 is configured to redirect laterally propagating light within the LED chip 12, the top side or surface of the LED chip 12 that is visible in FIG. 3C thereby forms a light-emitting surface within the LED package 36.

FIGS. 4A to 4C illustrate a top view of another LED package 38 at various fabrication steps of FIG. 2. In particular, FIG. 4A is a top view of the LED package 38 after the third step 26 of FIG. 2, FIG. 4B is a top view of the LED package 38 during the fourth step 28 of FIG. 2, and FIG. 4C is a top view of the LED package 38 after the fifth step 30 of FIG. 2. In FIG. 4A, two droplets of the light-altering material 22 are dispensed proximate peripheral edges or opposing corners of the LED chip 12. As illustrated in FIG. 4B, the droplets of the light-altering material 22 are allowed to wet the surface of the submount 14, the peripheral edges of the LED chip 12, and edges of the optional electrical overstress element 16. As further illustrated in FIG. 4C, the droplets of the light-altering material 22 are allowed to completely surround peripheral edges of the LED chip 12 before being cured in place. While the droplets of the light-altering material 22 are illustrated in FIG. 4A at opposing corners of the LED chip 12, the principles disclosed may be equally applicable to embodiments where the two droplets are dispensed along opposing peripheral edges of the LED chip 12.

Figures 5A, 5B, 5C, 6, 7:
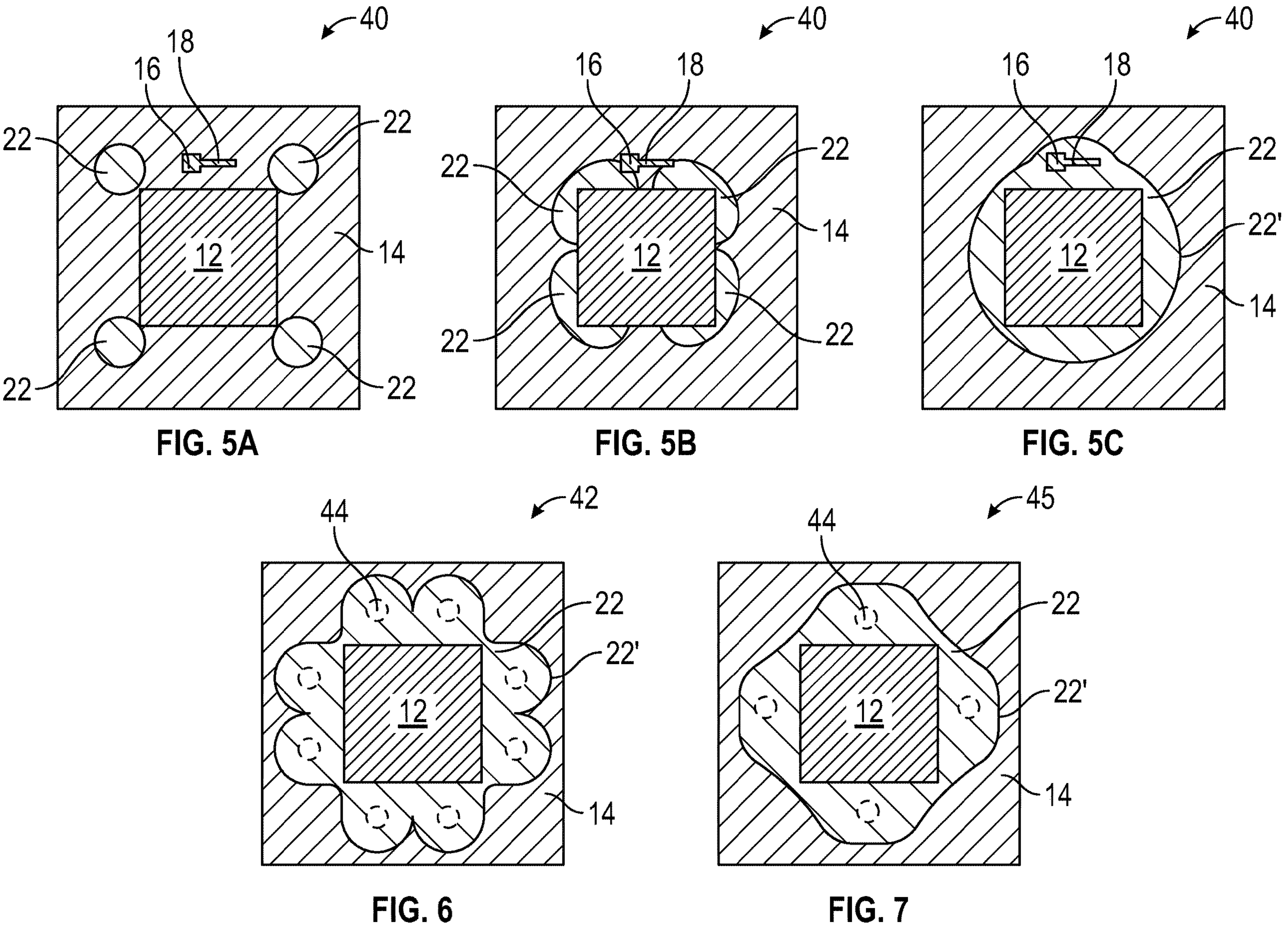
FIG. 5A is a top view of another LED package after selective dispensing of four droplets of light-altering material according to the fabrication sequence of FIG. 2.
FIG. 5B is a top view of the LED package of FIG. 5A during wicking of the light-altering material according to the fabrication sequence of FIG. 2.
FIG. 5C is a top view of the LED package of FIG. 5B after curing of the light-altering material according to the fabrication sequence of FIG. 2.
FIG. 6 is a top view of an LED package that is similar to the LED package of FIGS. 5A to 5C, except that multiple droplets of the light-altering material are initially dispensed along each edge of the LED chip.
FIG. 7 is a top view of an LED package that is similar to the LED package of FIGS. 5A to 5C, except that droplets of the light-altering material are initially dispensed along opposing edges of the LED chip.

FIGS. 5A to 5C illustrate a top view of another LED package 40 at various fabrication steps of FIG. 2. In particular, FIG. 5A is a top view of the LED package 40 after the third step 26 of FIG. 2, FIG. 5B is a top view of the LED package 40 during the fourth step 28 of FIG. 2, and FIG. 5C is a top view of the LED package 40 after the fifth step 30 of FIG. 2. The LED package 40 is similar to the LED package 38 of FIGS. 4A to 4C, except that four droplets of the light-altering material 22 are dispensed as illustrated in FIG. 5A. While the droplets of the light-altering material 22 are illustrated at corners of the LED chip 12, the principles disclosed may be equally applicable to embodiments where the four droplets are dispensed along all peripheral edges of the LED chip 12.

FIG. 6 is a top view of an LED package 42 that is similar to the LED package 40 of FIGS. 5A to 5C, except that multiple droplets of the light-altering material 22 are initially dispensed along each edge of the LED chip 12. The view provided in FIG. 6 is similar to FIG. 5C. As such, the droplets of the light-altering material 22 have been allowed to coalesce together around the peripheral edges of the LED chip 12. Initial locations 44 of the droplets are indicated by superimposed dashed circles. The light-altering material 22 of FIG. 6 may be provided with higher viscosity such that the wicking step allows the droplets to coalesce while peripheral edges 22' of the light-altering material 22 generally retain an outline of the initial droplets. In this manner, the peripheral edges 22' may be provided with a generally irregular or asymmetric shape along the submount 14.

FIG. 7 is a top view of an LED package 45 that is similar to the LED package 40 of FIGS. 5A to 5C, except that droplets of the light-altering material 22 are initially dispensed along opposing edges of the LED chip 12. The view provided in FIG. 7 is similar to FIG. 5C. As such, the droplets of the light-altering material 22 have been allowed to coalesce together around the peripheral edges of the LED chip 12. As with FIG. 6, initial locations 44 of the droplets are indicated by superimposed dashed circles in FIG. 7. The light-altering material 22 of FIG. 7 may be provided with lower viscosity as compared to FIG. 6 such that the wicking step allows the droplets to coalesce and wick along greater distances of the submount 14. In this manner, the peripheral edges 22' of the light-altering material 22 have generally smoother profiles along the submount 14. In certain aspects, portions of the peripheral edges 22' may extend closer to peripheral edges of the submount 14 that may be registered with encapsulant flash portions (20" of FIG. 1B). However, as illustrated in FIG. 7, only certain portions of the light-altering material 22 extend in this manner. Accordingly, a majority of the encapsulant flash portions (20" of FIG. 1B) may be formed on areas of the submount 14 that are outside the light-altering material 22.

Figure 8:
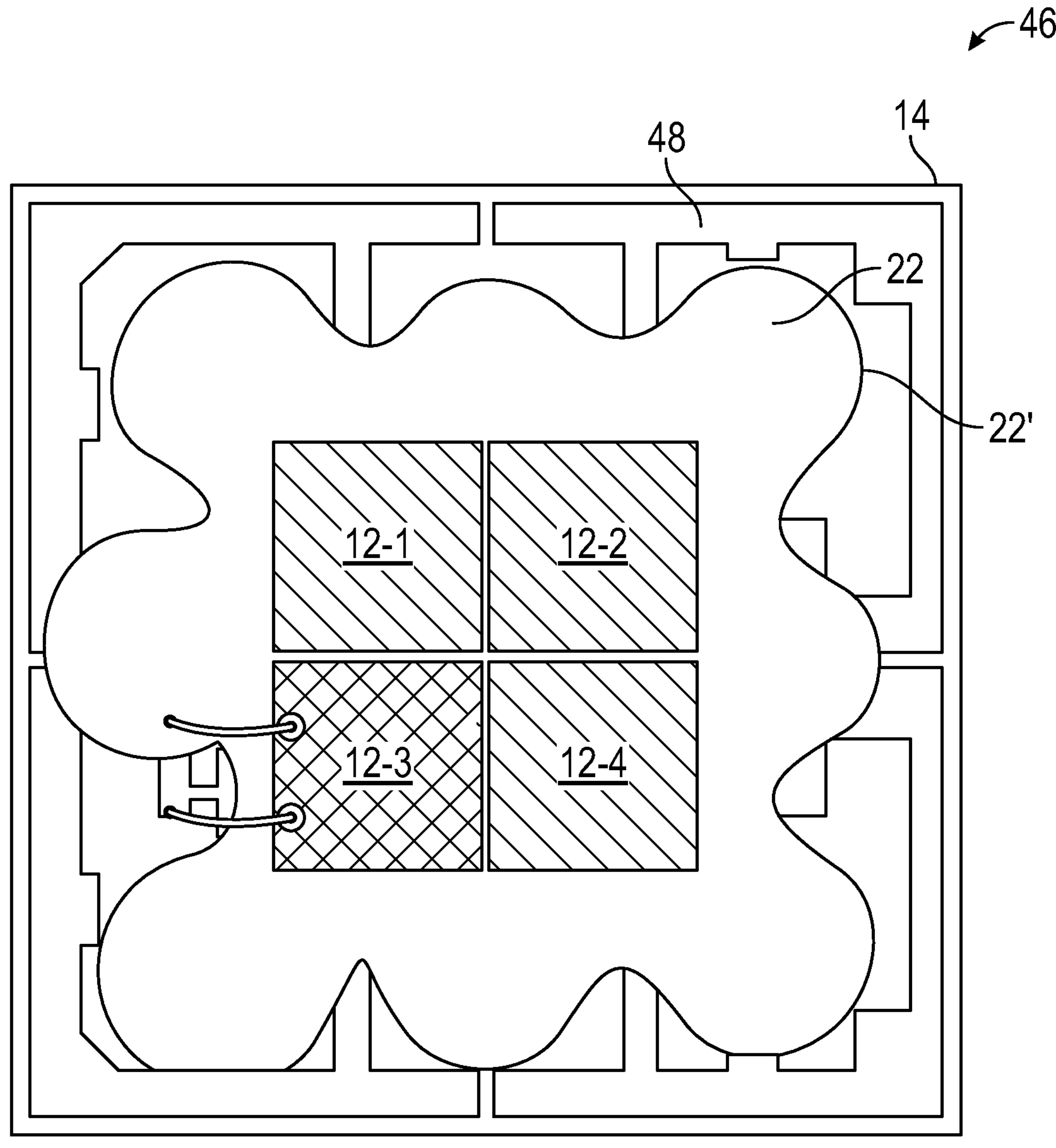
FIG. 8 is a top view of an LED package that is similar to the LED package of FIG. 7 except that the LED package includes a plurality of LED chips.

FIG. 8 is a top view of an LED package 46 that is similar to the LED package 45 of FIG. 7 except that the LED package 46 includes a plurality of LED chips 12-1 to 12-4. The LED chips 12-1 to 12-4 may include various combinations of chip types and/or LED chip orientations. For example, different chip types may include a first LED chip 12-1, a second LED chip 12-2, and a fourth LED chip 12-4 each being configured to emit a combination of blue wavelengths of light along with wavelength-converted light from a lumiphoric material that is individually registered with each LED chip 12-1, 12-2, and 12-4. A third LED chip 12-3 may be configured to emit red wavelengths of light. In certain embodiments, the third LED chip 12-3 may be arranged with a vertical orientation with electrical connections being made on opposing sides while the LED chips 12-1, 12-2, and 12-4 may be arranged with flip-chip orientations. The above example is one of many applicable arrangements for the LED chips 12-1 to 12-4. In other examples, the LED chips 12-1 to 12-4 may each emit a different wavelength or combination of wavelengths of light, such as red, blue, green, and white wavelengths, among others. A pattern of metal traces 48 may be provided on the submount 14 for providing electrical connections to the LED chips 12-1 to 12-4. In certain aspects, the metal traces 48 may be arranged such that each of the LED chips 12-1 to 12-4 is individually controllable. As illustrated, the light-altering material 22 is selectively provided along peripheral edges of each of the LED chips 12-1 to 12-4, and peripheral edges 22' of the light-altering material 22 are inset from peripheral edges of the submount 14. In certain embodiments, the wicking or capillary action of the light-altering material 22 before curing allows the light-altering material 22 to fill gaps between neighboring ones of the LED chips 12-1 to 12-4.

Figure 9A:
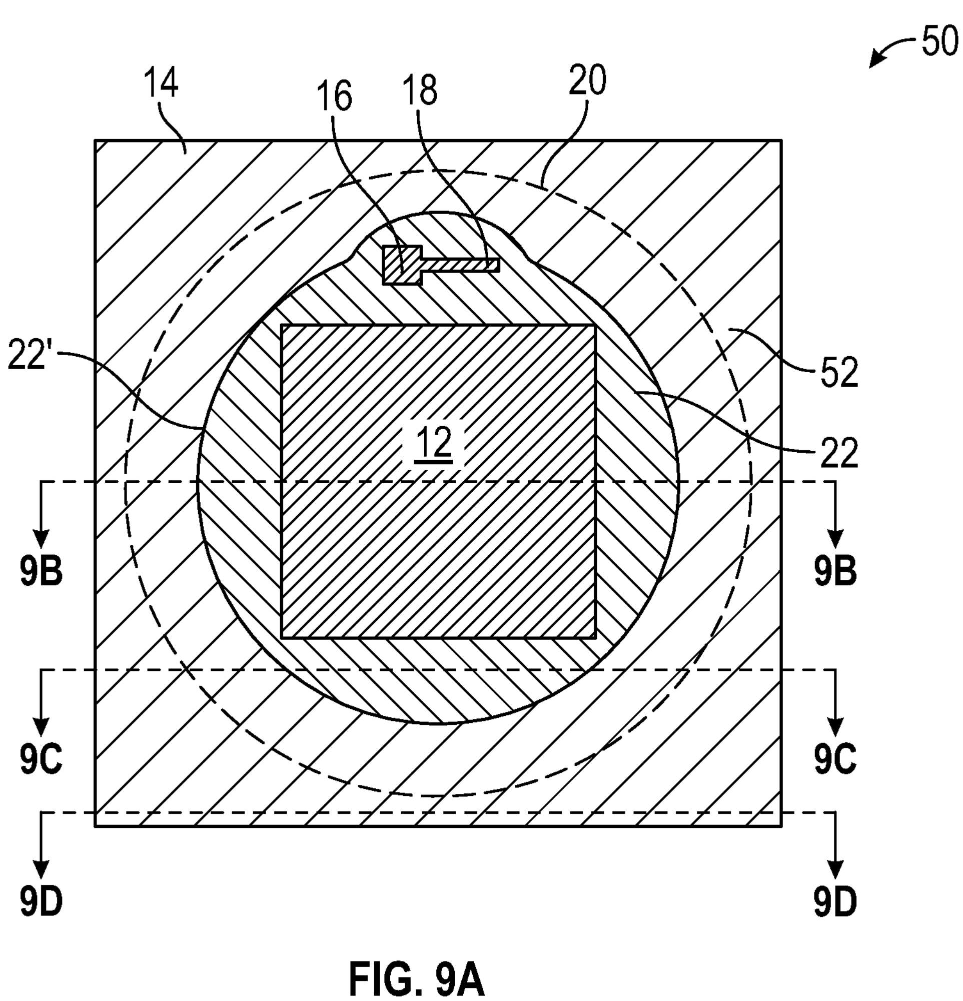
FIG. 9A is a top view of an LED package that is similar to the LED package of FIGS. 1A to 1D and further includes an arrangement of a lumiphoric material relative to the light-altering material.
Figure 9B:
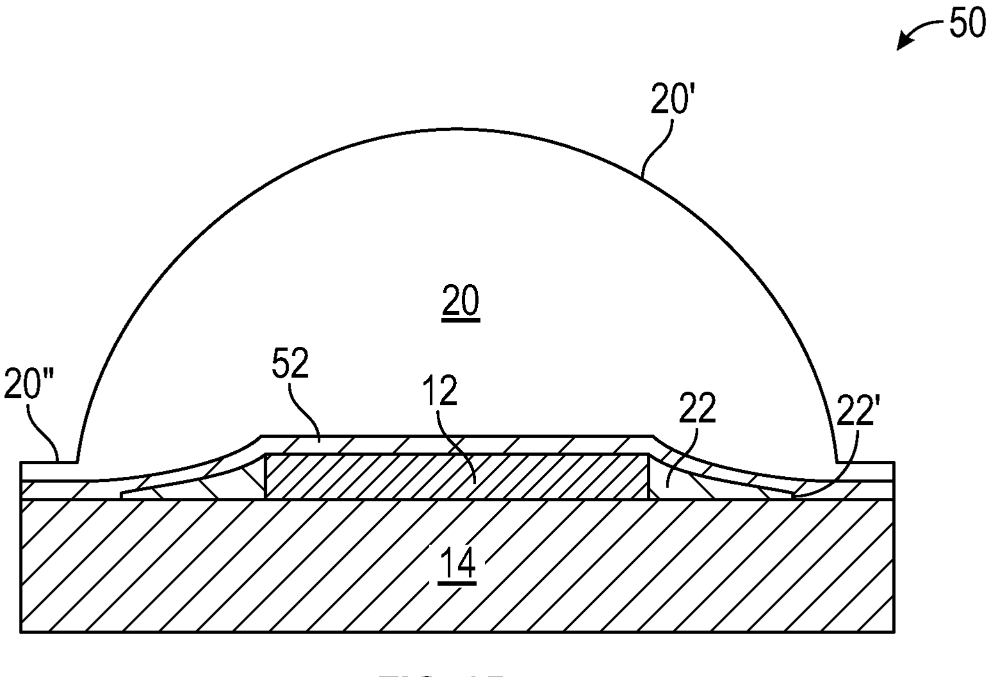
FIG. 9B is a cross-section of the LED package of FIG. 9A taken along the sectional line 9B-9B of FIG. 9A that includes the LED chip.
Figure 9C:
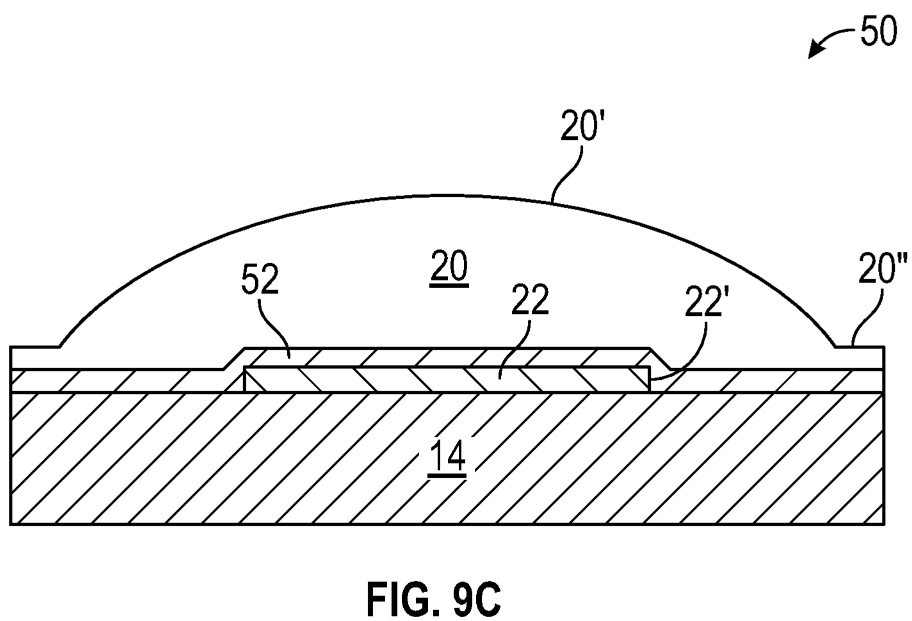
FIG. 9C is a cross-section of the LED package of FIG. 9A taken along the sectional line 9C-9C of FIG. 9A.
Figure 9D:
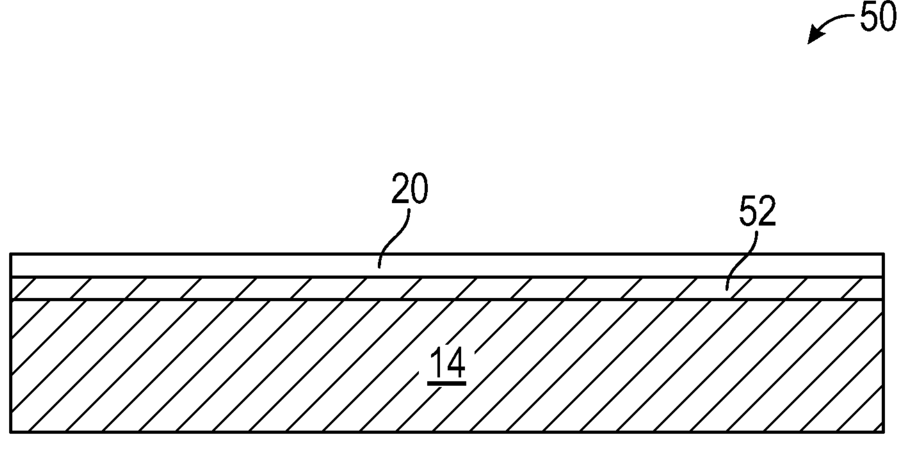
FIG. 9D is a cross-section of the LED package of FIG. 9A taken along the sectional line 9D-9D of FIG. 9A.

FIG. 9A is a top view of an LED package 50 that is similar to the LED package 10 of FIGS. 1A to 1D and further includes an arrangement of a lumiphoric material 52 relative to the light-altering material 22. FIG. 9B is a cross-section of the LED package 50 taken along the sectional line 9B-9B of FIG. 9A that includes the LED chip 12. FIG. 9C is a cross-section of the LED package 50 taken along the sectional line 9C-9C of FIG. 9A. FIG. 9D is a cross-section of the LED package 50 taken along the sectional line 9D-9D of FIG. 9A. For the LED package 50, the lumiphoric material 52 is formed after curing of the light-altering material 22 according to the sixth step 32 of the fabrication sequence of FIG. 2. In this manner, the lumiphoric material 52 may be arranged to cover the top side, or light-emitting surface, of the LED chip 12 along with covering the light-altering material 22. As with other embodiments, peripheral edges 22' of the light-altering material 22 may be inset from peripheral edges of the submount 14 and a height of the light-altering material 22 above the submount 14 may decrease with increasing distance from the LED chip 12. In this manner, a height of the lumiphoric material 52 may also decrease with increasing distance from the LED chip 12. In certain embodiments, the lumiphoric material 52 may be arranged to entirely cover the light-altering material 22 on the submount 14. In still further embodiments, the lumiphoric material 52 may be provided on portions of the submount 14 that are outside the LED chip 12 and the peripheral edges 22' of light-altering material 22. In such embodiments, portions of the lumiphoric material 52 may reside or be registered between the flash portions 20" of the encapsulant 20 and the submount 14.

Figure 10A:
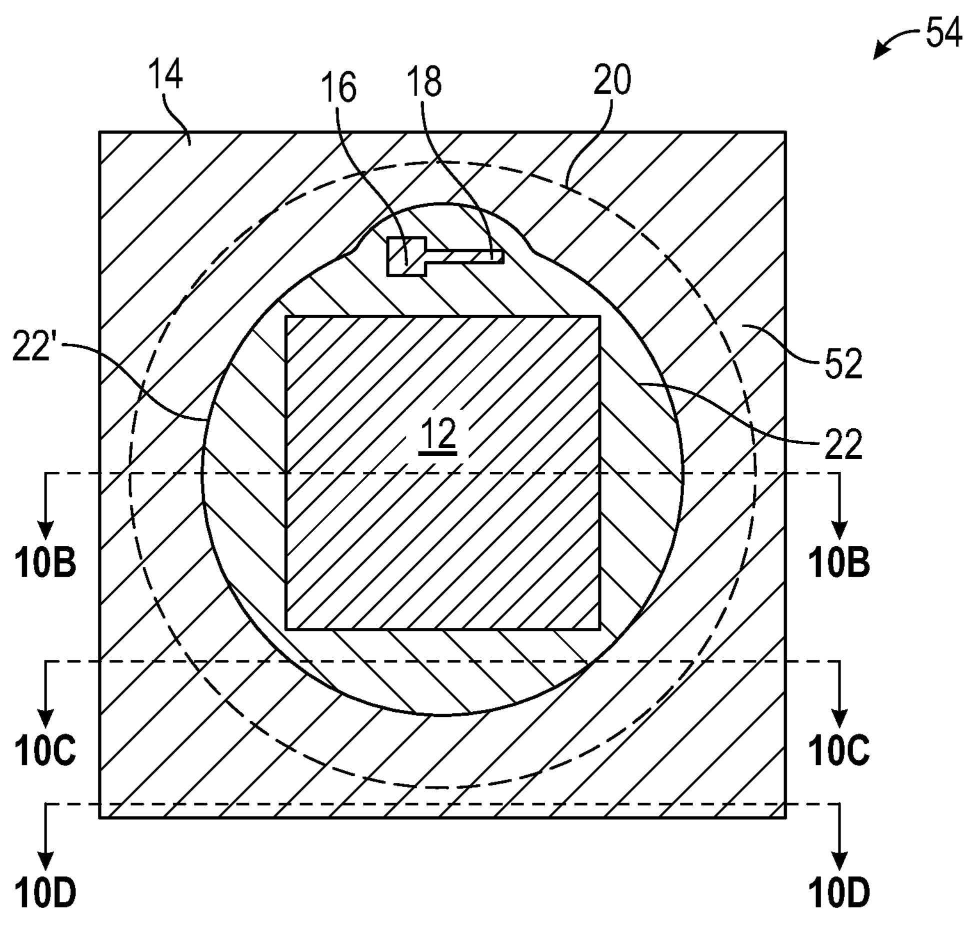
FIG. 10A is a top view of an LED package that is similar to the LED package of FIGS. 9A to 9D except the lumiphoric material is arranged between the light-altering material and the submount.
Figure 10B:
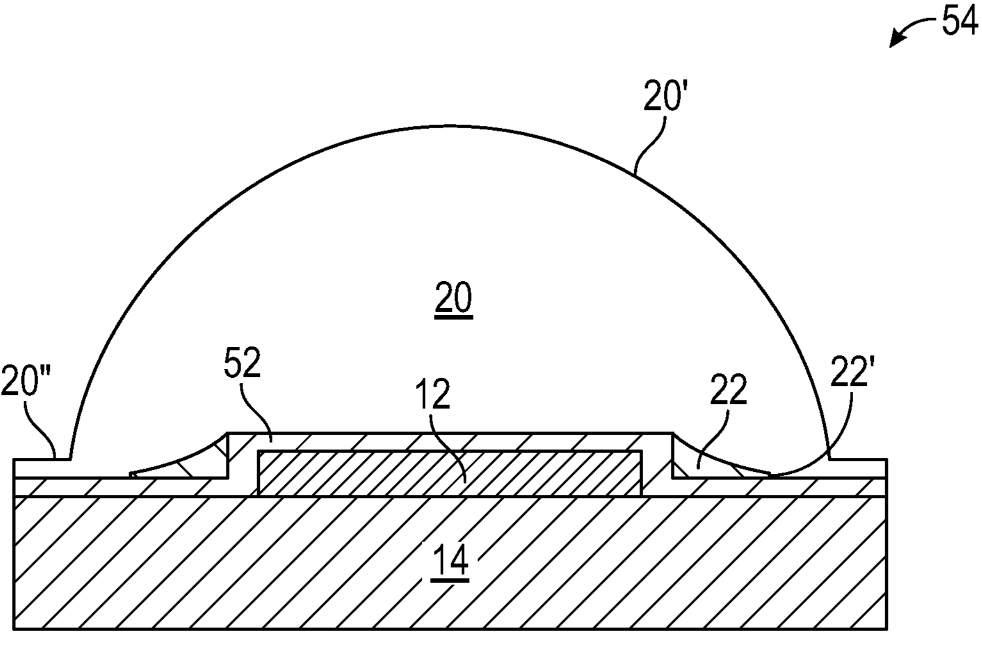
FIG. 10B is a cross-section of the LED package of FIG. 10A taken along the sectional line 10B-10B of FIG. 10A that includes the LED chip.
Figure 10C:
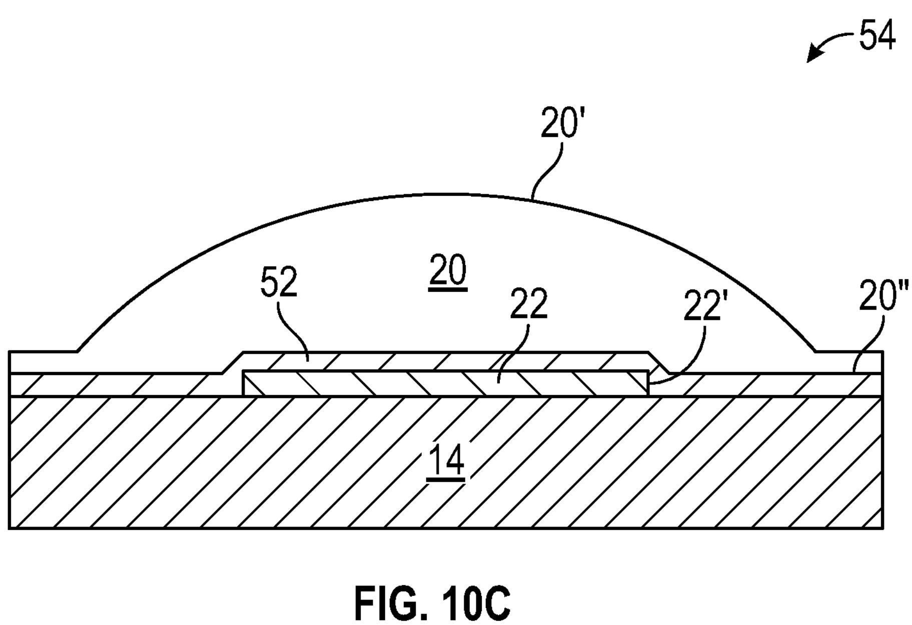
FIG. 10C is a cross-section of the LED package of FIG. 10A taken along the sectional line 10C-10C of FIG. 10A.
Figure 10D:
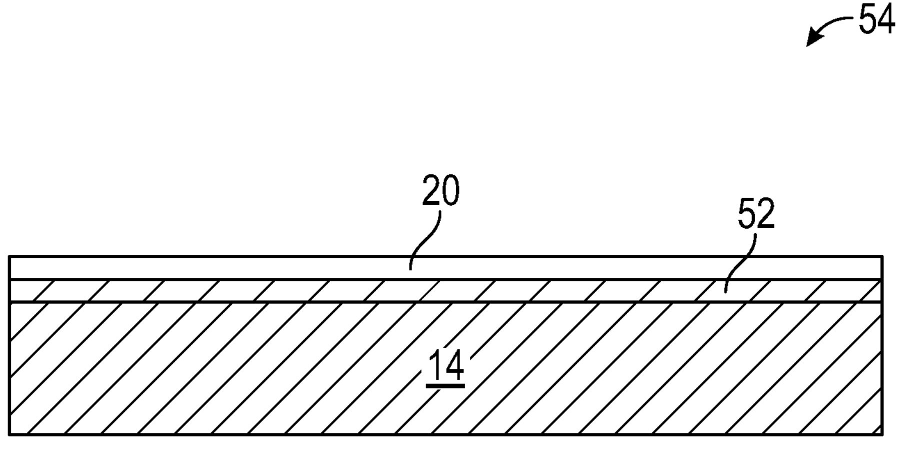
FIG. 10D is a cross-section of the LED package of FIG. 10A taken along the sectional line 10D-10D of FIG. 10A.

FIG. 10A is a top view of an LED package 54 that is similar to the LED package 50 of FIGS. 9A to 9D except the lumiphoric material 52 is arranged between the light-altering material 22 and the submount 14. FIG. 10B is a cross-section of the LED package 54 taken along the sectional line 10B-10B of FIG. 10A that includes the LED chip 12. FIG. 10C is a cross-section of the LED package 54 taken along the sectional line 10C-10C of FIG. 10A. FIG. 10D is a cross-section of the LED package 54 taken along the sectional line 10D-10D of FIG. 10A. For the LED package 54, the lumiphoric material 52 is formed before the light-altering material 22 is formed according to the second step 24 of the fabrication sequence of FIG. 2. In this manner, the light-altering material 22 is selectively dispensed and coalesced on surfaces of the lumiphoric material 52. As best illustrated in FIG. 10B, the lumiphoric material 52 may cover the top side of the LED chip 12 and portions of the submount 14 that are outside the LED chip 12. In certain embodiments, the lumiphoric material 52 may cover portions of the submount 14 that are registered with the flash portions 20" of the submount 14. The light-altering material 22 may be formed proximate peripheral edges of the LED chip 12 with the lumiphoric material 52 therebetween. In certain embodiments, a height of the light-altering material 22 above the submount 14 may be greater than a height of the LED chip 12, depending on the thickness of the underlying lumiphoric material 52. In other embodiments, the height of the light-altering material 22 may be the same or less than the height of the LED chip 12 to provide a different emission pattern for the LED package 54. As with other embodiments, peripheral edges 22' of the light-altering material 22 may be inset from peripheral edges of the submount 14 and the height of the light-altering material 22 above the submount 14 may decrease with increasing distance from the LED chip 12. For embodiments where the encapsulant 20 includes a flash portion 20", peripheral edges 22' of the light-altering material 22 may be arranged in locations of the submount 14 that are not registered with the flash portion 20".

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:

a submount;

a pattern of metal traces on the submount;

at least one LED chip on the submount and electrically coupled with the pattern of metal traces, the at least one LED chip including a first side, a second side that is mounted to the submount, and peripheral edges that bound the first side and the second side;

a light-altering material directly on the peripheral edges of the at least one LED chip and on portions of the submount that are proximate the at least one LED chip such that peripheral edges of the light-altering material are curved at an interface with the submount in a position that is between peripheral edges of the submount and the at least one LED chip, the light-altering material comprising a light-reflective material; and a lumiphoric material on the first side of the at least one LED chip and on the light-altering material, wherein a height of the lumiphoric material above the submount gradually decreases across the submount with increasing distance from the peripheral edges of the at least one LED chip.

2. The LED package of claim 1, wherein a height of the light-altering material above the submount decreases across the submount with increasing distance from the peripheral edges of the at least one LED chip.

3. The LED package of claim 2, wherein the height of the light-altering material at the peripheral edges of the light-altering material is less than 10% of a height of the at least one LED chip.

4. The LED package of claim 1, further comprising an electrical overstress element on the submount, wherein the light-altering material is further arranged to surround edges of the electrical overstress element.

5. The LED package of claim 1, further comprising an encapsulant that is arranged on the submount, wherein the encapsulant includes a lens portion and a flash portion that forms a lateral extension of the encapsulant from the lens portion to the peripheral edges of the submount, wherein the peripheral edges of the light-altering material are registered within the lens portion of the encapsulant.

6. The LED package of claim 1, wherein the at least one LED chip comprises a plurality of LED chips on the submount and the light-altering material is arranged on peripheral edges of each LED chip of the plurality of LED chips.

7. The LED package of claim 6, wherein the light-altering material is further arranged in gaps formed between neighboring LED chips of the plurality of LED chips.

8. The LED package of claim 1, wherein the lumiphoric material entirely covers the light-altering material.

9. The LED package of claim 8, wherein a height of the lumiphoric material extends to the peripheral edges of the submount.

10. The LED package of claim 9, wherein portions of the lumiphoric material are arranged on portions of the submount that are outside the peripheral edges of the light-altering material.

11. The LED package of claim 10, further comprising an encapsulant that is arranged on the submount, wherein the encapsulant includes a lens portion and a flash portion that forms a lateral extension of the encapsulant from the lens portion to the peripheral edges of the submount, wherein the peripheral edges of the light-altering material are registered within the lens portion of the encapsulant and the portions of the lumiphoric material are registered with the flash portion of the encapsulant.

12. A method comprising:

providing a light-emitting diode (LED) chip on a submount;

dispensing a plurality of droplets of light-altering material proximate the LED chip on the submount, each droplet of the plurality of droplets being spaced apart from other droplets of the plurality of droplets proximate the LED chip;

allowing the plurality of droplets of light-altering material to wick along a surface of the submount and along peripheral edges of the LED chip, the light altering material comprising a light-reflective material; and curing the light-altering material.

13. The method of claim 12, wherein dispensing the plurality of droplets of light-altering material comprises dispensing the plurality of droplets of light-altering material proximate the peripheral edges of the LED chip.

14. The method of claim 13, further comprising allowing the plurality of droplets of light-altering material to coalesce along the surface of the submount and along the peripheral edges of the LED chip.

15. The method of claim 12, wherein the plurality of droplets of light-altering material are allowed to wick along the surface of the submount at a temperature in a range from 20° C. to 100° C.

16. The method of claim 12, further comprising forming an encapsulant on the LED chip and on the light-altering material.

17. The method of claim 12, further comprising forming a lumiphoric material on the LED chip before dispensing the plurality of droplets of light-altering material.

18. The method of claim 12, further comprising forming a lumiphoric material on the LED chip after curing the light-altering material.

19. A light-emitting diode (LED) package comprising:

a submount;

at least one LED chip on the submount, the at least one LED chip including a first side, a second side that is mounted to the submount, and peripheral edges that bound the first side and the second side;

a lumiphoric material on the first side and on the peripheral edges of the at least one LED chip; and a light-altering material directly on a top surface and directly on a side surface of the lumiphoric material relative to the submount, the light-altering material being proximate the peripheral edges of the at least one LED chip such that peripheral edges of the light-altering material are arranged in positions that are between peripheral edges of the submount and the at least one LED chip, the light-altering material comprising a light-reflective material.

20. The LED package of claim 19, wherein a height of the light-altering material above the submount decreases across the submount with increasing distance from the peripheral edges of the at least one LED chip.

21. The LED package of claim 19, further comprising an encapsulant that is arranged on the submount, wherein the encapsulant includes a lens portion and a flash portion that forms a lateral extension of the encapsulant from the lens portion to the peripheral edges of the submount, wherein the peripheral edges of the light-altering material are registered within the lens portion of the encapsulant.

22. The LED package of claim 19, wherein a height of the light-altering material above the submount is greater than a height of the at least one LED chip above the submount.

23. The LED package of claim 19, further comprising an electrical overstress element on the submount, wherein the light-altering material is further arranged to surround edges of the electrical overstress element.

* * * * *